(12) United States Patent
Ogawa et al.

(10) Patent No.: US 7,285,498 B2
(45) Date of Patent: Oct. 23, 2007

(54) ETCHING METHOD

(75) Inventors: Kazuto Ogawa, Yamanashi-ken (JP);
Koichiro Inazawa, deceased, late of
Beverly, MA (US); by Rie Inazawa,
legal representative, Yamanashi-ken
(JP); Hisataka Hayashi, Kanagawa-ken
(JP); Tokuhisa Ohiwa, Kanagawa-ken
(JP)

(73) Assignees: Tokyo Electron Limited, Tokyo-To
(JP); Kabushiki Kaisha Toshiba,
Tokyo (JP)

( * ) Notice: Subject to any disclaimer, the term of this patent is extended or adjusted under 35 U.S.C. 154(b) by 221 days.

(21) Appl. No.: 10/956,365

(22) Filed: Oct. 4, 2004

(65) Prior Publication Data

US 2005/0085077 A1    Apr. 21, 2005

(51) Int. Cl.
*H01L 21/461* (2006.01)
*H01L 21/302* (2006.01)

(52) U.S. Cl. ............ 438/706; 438/707; 438/710; 438/714; 438/725; 438/734

(58) Field of Classification Search ............ None
See application file for complete search history.

(56) References Cited

U.S. PATENT DOCUMENTS

| 5,266,157 A | 11/1993 | Kadomura |
| 6,143,640 A * | 11/2000 | Cronin et al. ............ 438/618 |
| 6,387,819 B1 * | 5/2002 | Yu ............ 438/725 |

FOREIGN PATENT DOCUMENTS

| JP | 01-280316 | 11/1989 |
| JP | 04-142738 | 5/1992 |
| JP | 05-013374 | 1/1993 |
| JP | 05-234956 | 9/1993 |
| JP | 09-082691 | 3/1997 |
| JP | 2000-021846 | 1/2000 |
| WO | WO 03/083921 | 10/2003 |

OTHER PUBLICATIONS

Notification of Receipt of Record Copy (Form PCT/IB/301) issued in connection with PCT/JP03/03745, Oct. 2003.
Notification Concerning Submission or Transmittal of Priority Document (Form PCT/IB/304) issued in connection with PCT/JP03/03745, May 2003.
Notice Informing the Applicant of the Communication of the International Application to the Designated Offices (Form PCT/IB/308) issued in connection with PCT/JP03/03745, Jun. 2003.

* cited by examiner

*Primary Examiner*—Duy-Vu N. Deo
(74) *Attorney, Agent, or Firm*—Smith, Gambrell & Russell, LLP

(57) ABSTRACT

An etching method etches an organic film by using an inorganic film as a mask at a high etch rate, in a satisfactory etch profile in a satisfactory in-plane uniformity without causing the inorganic film to peel off. An organic film formed on a workpiece is etched by using an inorganic film as a mask with a plasma produced by discharging an etching gas in a processing vessel (1). The etching method uses a mixed gas containing $NH_3$ gas and $O_2$ gas for etching the organic film when the organic film is to be etched in a pattern having an opening ratio of 40% or above. The etching method uses $NH_3$ gas as an etching gas for etching the organic film when the organic film is to be etched in a pattern having an opening ratio below 40%.

19 Claims, 12 Drawing Sheets

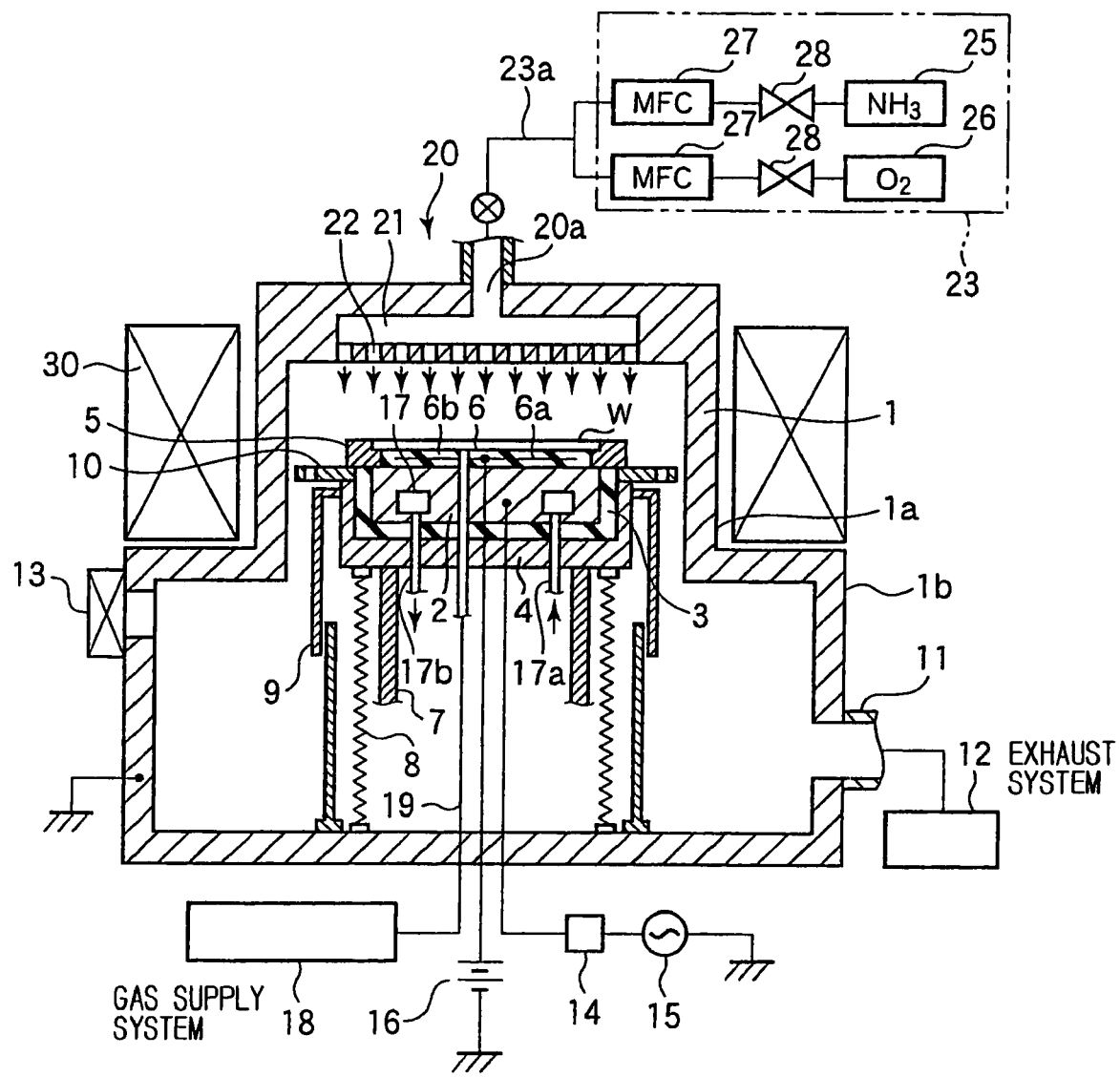
F I G. 1

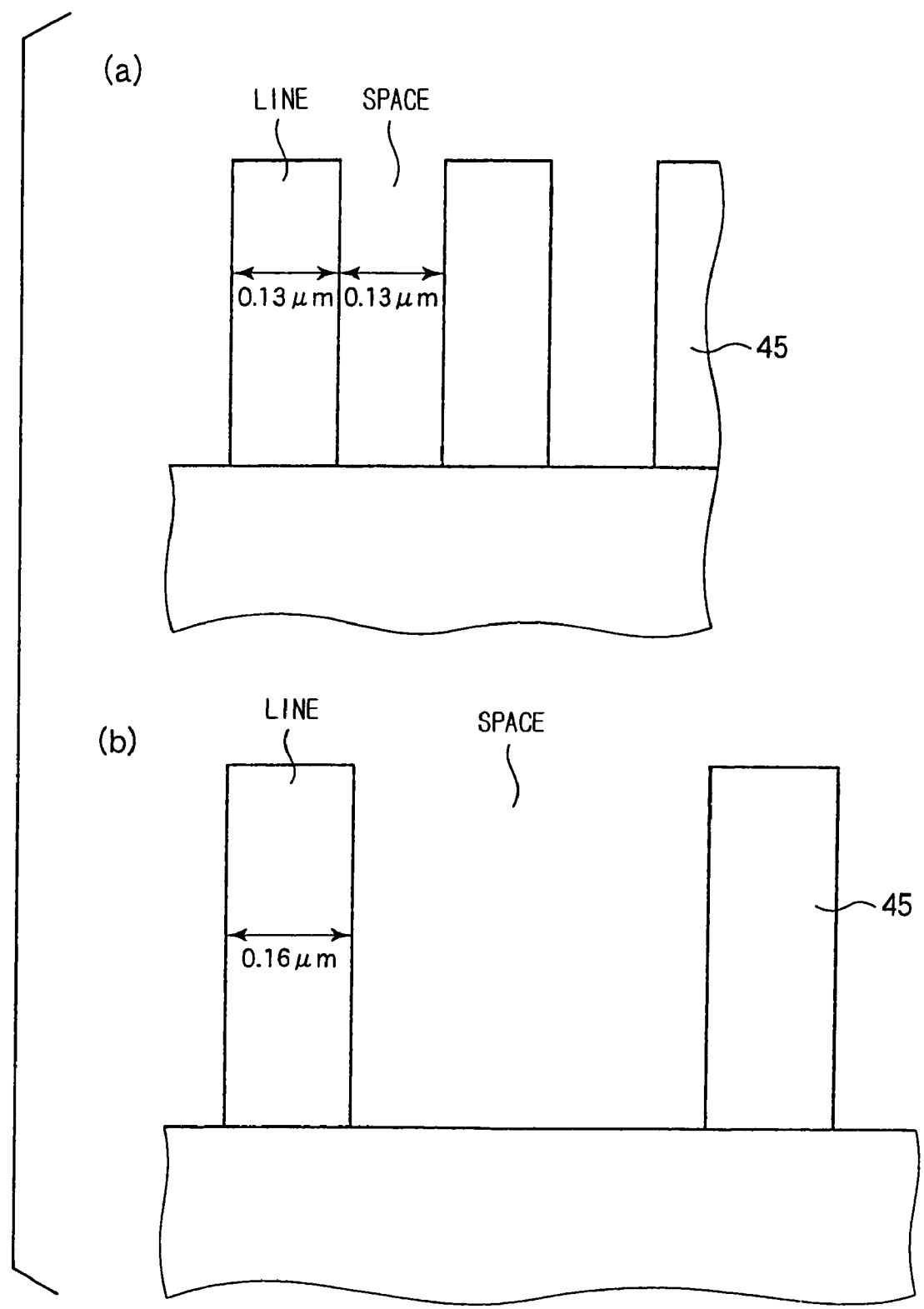
F I G. 7

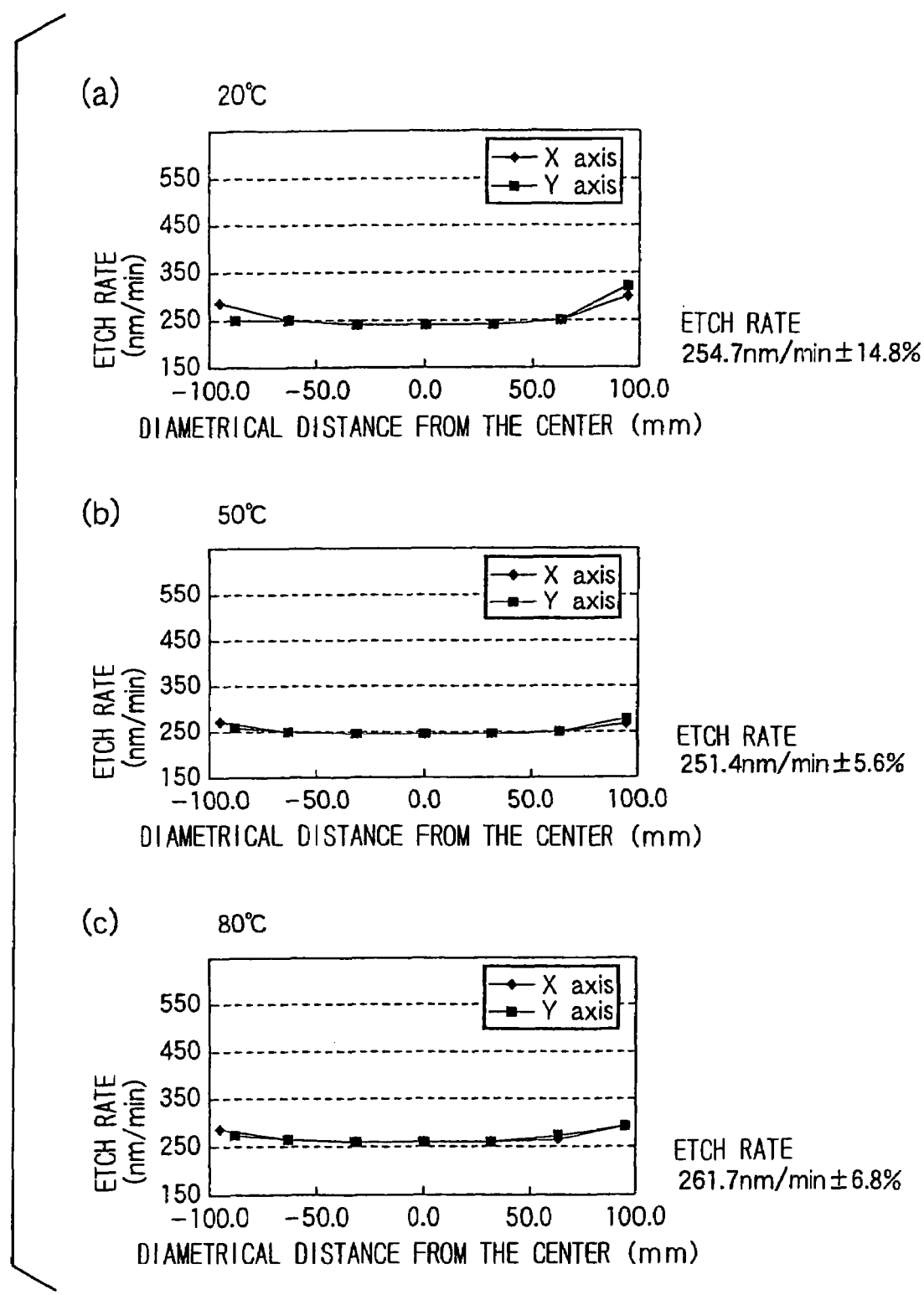
F I G. 9

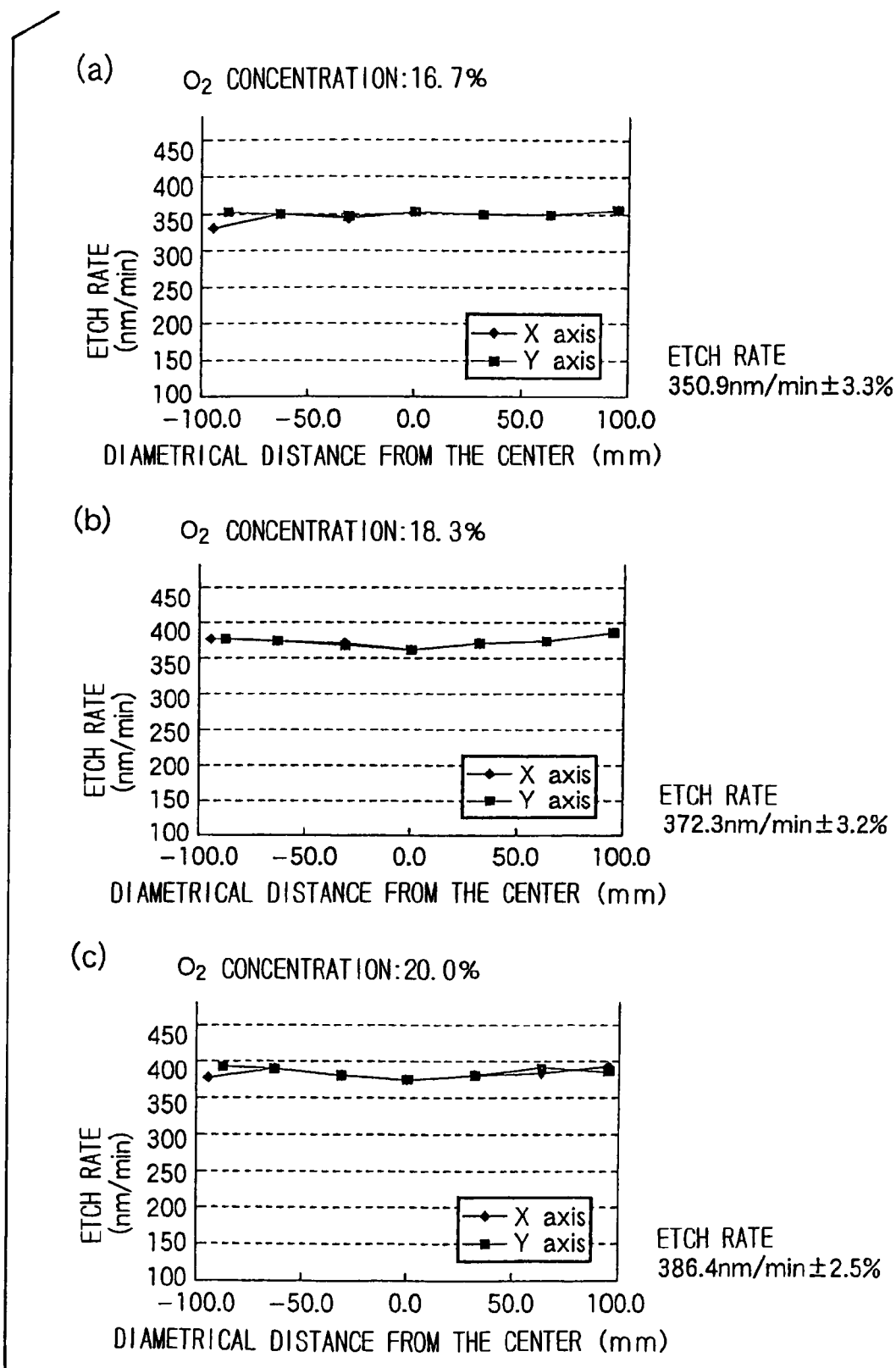
F I G. 11

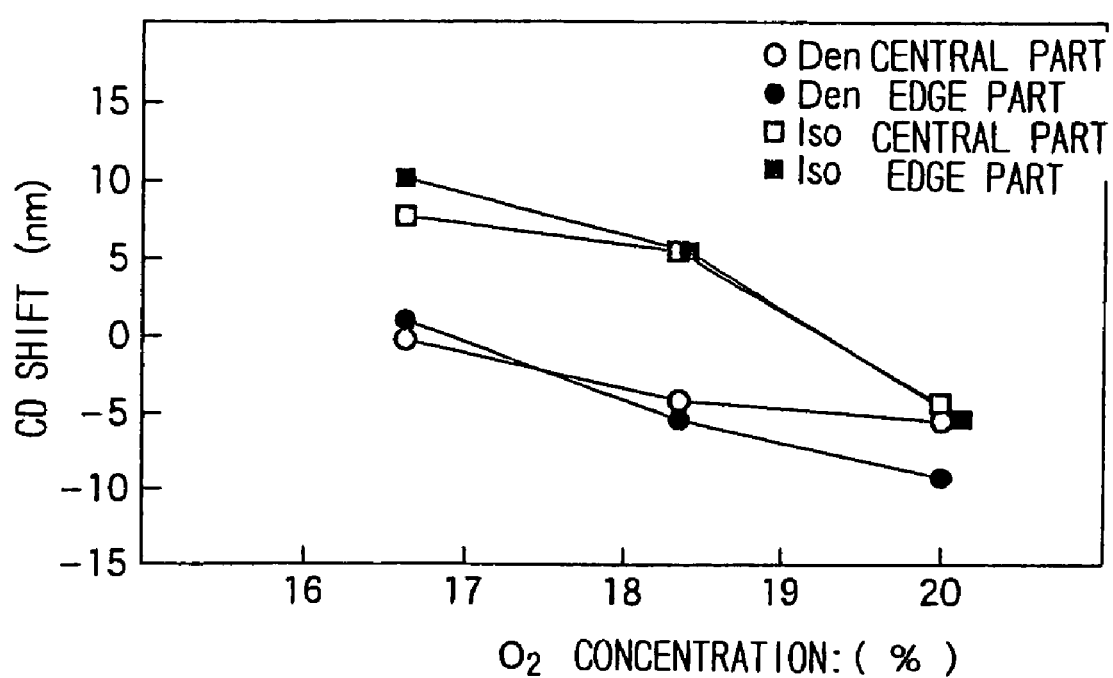
F I G. 12

ETCHING METHOD

TECHNICAL FIELD

The present invention relates to an etching method of plasma-etching an organic film formed on a workpiece, such as a semiconductor wafer, using a mask formed by patterning an inorganic film.

BACKGROUND ART

Further increase in the number of component parts per semiconductor device has been desired in recent years, and the formation of further minute patterns has been required accordingly. To meet such a requirement, a photolithographic process needs to form a thin resist film on a semiconductor wafer to form a minute pattern of a high resolution by a dry etching process.

When a thin resist film is used to form a minute pattern, a film to be etched cannot be etched in a satisfactory profile. Because an etching selectivity of the film to be etched relative to the resist film is not enough.

A conventional technique uses a multilayer resist film to solve such a problem. A multilayer resist film, for example, consists of a lower resist film of an organic material formed on a film to be etched, a SOG film (spin-on-glass film), namely, an inorganic film, formed on the lower resist film, and an upper resist film of a photoresist formed on the SOG film.

The upper resist film, namely, the photoresist film, is subjected to exposure and developing processes to form a patterned photoresist film, the SOG film underlying the patterned photoresist film is etched by using the patterned photoresist film as a mask, and then the organic lower resist film is etched by using the etched SOG film.

It has been usual to etch the organic lower resist film underlying the SOG film by using the SOG film as a mask in a $N_2/O_2$ atmosphere. However, such an etching method could not etch the organic lower resist film at a satisfactorily high etch rate.

A technique disclosed in JP 1-280316 A intended to solve such a problem uses an etching gas containing $NH_3$ gas for etching such a multilayer resist film to etch the multilayer resist film at a high etch rate.

The technique disclosed in JP 1-280316 A, however, is incapable of achieving etching at a high etch rate for some combination of an etching gas and a pattern, the controllability of CD shift is unsatisfactory, the film is etched in a bowing shape, and in-plane etch uniformity is unsatisfactory. More over, the SOG film is liable to come off when the pattern has a small opening ratio, i.e., the ratio of the area of openings formed in a film to the total area of the film. These problems arise not only in etching a multilayer resist film, but also in etching an organic film by using an inorganic film as a mask.

DISCLOSURE OF THE INVENTION

The present invention has been made in view of the foregoing circumstances and it is therefore an object of the present invention to provide an etching method of etching an organic film by using an inorganic film as a mask, capable of etching the organic film in a pattern at a high etch rate in a satisfactory etch profile in a high in-plane uniformity without causing the inorganic film to come off.

The inventors of the present invention made studies to solve the foregoing problems and have found that, the most suitable etching gas for etching an organic film in a pattern having an opening ratio of 40% or above and the most suitable etching gas for etching the organic film in a pattern having an opening ratio below 40% are different, the former pattern and the latter pattern can be formed by etching the organic films at a high etch rate by using a mixed gas containing $NH_3$ gas and $O_2$ gas, and $NH_3$ gas, respectively, in satisfactory etch profiles in satisfactory in-plane uniformity without causing the inorganic film to come off, and that the uniformity of etching can be further improved by adjusting the residence time of the etching gas.

An etching method in a first aspect of the present invention using an inorganic film as a mask for etching an organic film formed on a workpiece with a plasma of an etching gas in a processing vessel is characterized in that a mixed gas containing $NH_3$ gas and $O_2$ gas is used for etching the organic film when the organic film is to be etched in a pattern having an opening ratio of 40% or above, and $NH_3$ gas is used as an etching gas for etching the organic film when the organic film is to be etched in a pattern having an opening ratio below 40%.

Preferably, a support device supporting the workpiece is maintained at a temperature in the range of 40 to 80° C. when the organic film is to be etched in a pattern having an opening ratio of 40% or above, and is maintained the support device supporting the workpiece at a temperature in the range of −20 to 40° C. when the organic film is to be etched in a pattern having an opening ratio below 40%. Preferably, the etching gas is supplied so that the residence time of the etching gas is in the range of 4 to 10 msec when the organic film is to be etched in a pattern having an opening ratio of 40% or above, and the etching gas is supplied so that the residence time of the etching gas is 100 msec or below when the organic film is to be etched in a pattern having an opening ratio below 40%.

An etching method in a second aspect of the present invention using an inorganic film as a mask for etching an organic film formed on a workpiece with a plasma of an etching gas in a processing vessel is characterized in carrying out, in the same processing vessel, a first etching process using a mixed gas containing $NH_3$ gas and $O_2$ gas for etching the organic film when the organic film is to be etched in a pattern having an opening ratio of 40% or above, and a second etching process using $NH_3$ gas as an etching gas for etching the organic film when the organic film is to be etched in a pattern having an opening ratio below 40%.

The etching method uses etching gases selectively according to the opening ratio of a pattern in which the organic film is to be etched, and carries out the first and the second etching process in the same processing vessel. Thus the organic films to be patterned respectively in different patterns respectively having different opening ratios can be etched simply by changing the etching gas without significantly changing other processing conditions. Therefore, workpieces provided with organic films to be etched respectively having different patterns can be satisfactorily processed in the same processing vessel without causing an inorganic film overlying the organic film to come off at a high etch rate in a satisfactory in-plane uniformity efficiently.

Preferably, the temperature of a support device supporting the workpiece is in the range of 20 to 40° in the first and the second etching process. Preferably, the $NH_3/O_2$ flow rate ratio is determined so that the absolute value of CD shift is 6 nm or below when the organic film is to be etched in a pattern having an opening ratio of 40% or above, and the residence time of $NH_3$ gas is determined so that the absolute value of CD shift is 6 nm or below when the organic film is to be etched in a pattern having an opening ratio below 40%.

In all the foregoing cases, typically, patterns having an opening ratio of 40% or above are line-and-space patterns, and patterns having an opening ratio below 40% are perforated patterns.

An inorganic material forming the inorganic film may contain silicon oxide as a principal component. A low-K film is the most suitable organic film. The workpiece may be provided with a film to be etched underlying the organic film, and the film to be etched may be etched by using the organic film as a mask. The film to be etched may be at least one of $SiO_2$ film, a SiON film, a SiN film, a SiOC film and a SiC film.

Preferably, the plasma is produced by a capacitively coupled plasma producing device that creates a high-frequency electric field between a pair of electrodes. Preferably, a magnetic field perpendicular to the electric field is created between the pair of electrodes for etching.

According to the present invention, software programs to be executed by a computer are stored in a recording medium, and the computer reads the software programs from the storage medium and executes operations specified by the software programs.

According to a third aspect of the present invention, a storage medium storing software specifying control operations to be executed to control an etching apparatus by a computer to etch a layer to be etched underlying a pattern layer formed on a surface of a workpiece by using the pattern layer as a mask by an etching procedure including the steps of: determining an opening ratio of a pattern formed in the pattern layer; setting at least one of etching parameters; and etching the layer to be etched on the basis of the etching parameters.

According to a fourth aspect of the present invention, a storage medium storing software specifying control operations to be executed to control an etching apparatus by a computer to etch a layer of an organic material to be etched underlying a pattern layer of an inorganic material formed on a surface of a workpiece by using the pattern layer as a mask by an etching procedure including the steps of: determining an opening ratio of a pattern formed in the pattern layer; comparing the opening ratio with a predetermined reference opening ratio; selecting either a mixed gas prepared by mixing $NH_3$ and $O_2$ or $NH_3$ as an etching gas on the basis of the result of comparison of the opening ratio with the reference opening ratio; and etching the layer to be etched by using the selected etching gas.

BRIEF DESCRIPTION OF THE DRAWINGS

FIG. 1 is a schematic sectional view of a magnetron RIE system for carrying out an etching method in a preferred embodiment according to the present invention;

FIG. 7 is a view of assistance in explaining dense and sparse line-and-space patterns;

FIG. 9 is a graph showing the dependence of etch rate and etch uniformity on the temperature of a support table in etching a film in a line-and-space pattern.

FIG. 11 is a graph showing the dependence of etch rate and etch uniformity on the $O_2$ ratio of an etching gas in etching a film in a line-and-space pattern on a support table kept at 40° C.;

FIG. 12 is a graph showing the dependence of CD shift on the $O_2$ ratio of an etching gas in etching a film in a line-and-space pattern on a support table kept at 40° C.

BEST MODE FOR CARRYING OUT THE INVENTION

Figure 2:
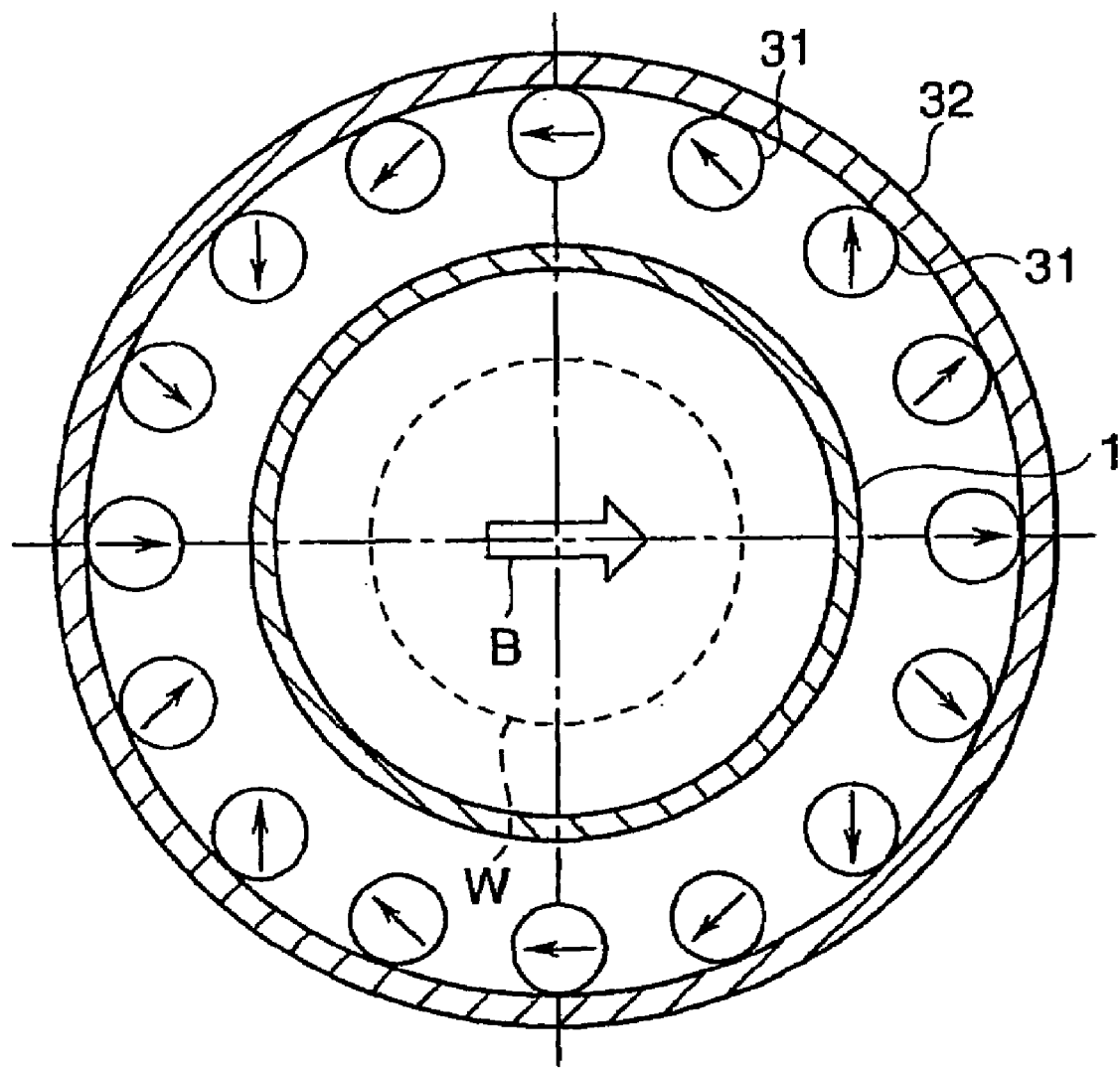
FIG. 2 is a typical cross-sectional view of a dipole magnetic ring surrounding a processing vessel included in the magnetron RIE system shown in FIG. 1.

Preferred embodiments of the present invention will be described with reference to the accompanying drawings.

An etching method in a preferred embodiment according to the present invention will be described as applied to etching an organic film using an inorganic film as a mask by a magnetron RIE system.

Referring to FIG. 1 showing a magnetron RIE system for carrying out the etching method of the present invention in a sectional view, the magnetron RIE system has a processing vessel 1 of a stepped cylindrical shape having an upper part 1*a* of a small diameter and a lower part 1*b* of a large diameter. The processing vessel 1 can be hermetically sealed. The processing vessel 1 has walls formed of, for example, aluminum.

A support table 2 is placed in the processing vessel 1 to support thereon a semiconductor wafer (hereinafter, referred to simply as "wafer") W, namely, a workpiece, in a horizontal position. The support table 2 is formed of, for example, aluminum. The support table 2 is mounted on an insulating plate 3 placed on a support base 4. A conductive focus ring 5 formed from, for example, a single silicon crystal, is disposed so as to surround space extending over the support table 2. The support table 2 and the support base 4 can be vertically moved by a ball screw mechanism including a ball screw 7. A space extending under the support base 4 and containing driving mechanisms is covered by a bellows 8 of a stainless steel. The bellows 8 is surrounded by a bellows cover 9. A baffle plate 10 surrounds the focus ring 5. The focus ring 5 is electrically connected by the baffle plate 10, the support base 4 and the bellows 8 to the processing vessel 1. The processing vessel 1 is grounded.

An exhaust port 11 is formed in the side wall of the lower part 1*b* of the processing vessel 1 and is connected to an evacuating system 12 including a vacuum pump. The internal space of the processing vessel 1 can be evacuated to a predetermined vacuum by operating the vacuum pump of the evacuating system 12. A gate valve 13 is attached to an upper part of the side wall of the lower part 1*b* of the processing vessel 1 to open and close an opening formed in the side wall of the lower part 1*b* to load a wafer W into and to unload the same from the processing vessel 1.

A matching device 14 is connected to the support table 2, and a high-frequency power source 15 for producing a plasma is connected to the matching device 14. The high-frequency power source 15 supplies high-frequency power of a predetermined frequency, such as 13.56 MHz or 40 MHz, to the support table 2. A shower head 20 is disposed above the support table 2 opposite to the support table 2. The lower surface of the shower head 20 and the upper surface of the support table 2 are parallel to each other. The shower head 20 is grounded. Thus, the shower head 20 and the support table 2 are paired opposite electrodes. Preferably, the distance between the electrodes is below 50 mm.

An electrostatic chuck 6 is mounted on the support table 2. The electrostatic chuck 6 attracts a wafer W electrostatically to hold the wafer W on the support table 2. The electrostatic chuck 6 has an insulating member 6b and an electrode 6a embedded in the insulating member 6b. The electrode 6a is connected to a dc power supply 16. The dc power supply 16 applies a voltage to the electrode 6a to attract a wafer W by electrostatic force, such as Coulomb's force.

A coolant chamber 17 is formed in the support table. A coolant is circulated through the coolant chamber 17 by supplying the coolant through a coolant supply pipe 17a into the coolant chamber 17 and discharging the coolant through the coolant discharge pipe 17b. The coolant exchanges heat through the support table 2 with a wafer supported on the support table 2 to keep the surface to be processed of the wafer W at a desired temperature.

A gas supply system 18 supplies a cooling gas through a gas supply line 19 into the gap between the upper surface of the electrostatic chuck 6 and the back surface of the wafer W so that the wafer W may be effectively cooled by the coolant circulating through the coolant chamber 17 even if the processing vessel 1 is evacuated and held at a vacuum by the evacuating system 12. The supply of the cooling gas into the gap makes the efficient transfer of the cold of the coolant to the wafer W to cool the wafer W efficiently.

The shower head 20 is incorporated into the top wall of the processing vessel 1 opposite to the support table 2. The shower head 20 has a lower wall provided with a plurality of gas discharging holes 22 and an upper wall provided with a gas inlet 20a. The shower head 20 has an internal space 21. A gas supply pipe 23a has one end connected to the gas inlet 20a and the other end connected to an etching gas supply system 23 for supplying etching gases. The etching gas supply system 23 has an $NH_3$ gas source 25 and an $O_2$ gas source 26. The gas supply pipe 23a is connected through lines provided with mass flow controller 27 and valves 28, respectively, to the NH3 gas source 25 and an $O_2$ gas source 26.

The $NH_3$ gas source 25 and the $O_2$ gas source 26 supply $NH_3$ gas and $O_2$ gas, respectively, through the etching gas supply pipe 23a and the gas inlet 20a into the space 21 in the shower head 20. The etching gases are discharged through the gas discharge holes 22 into the processing vessel 1.

A dipole magnetic ring 30 is disposed coaxially with the upper part 1a of the processing vessel 1 so as to surround the upper part 1a. As shown in FIG. 2 in a cross-sectional view, the dipole magnetic ring 30 is formed by attaching a plurality of cylindrical, anisotropic magnets 31 to an annular magnetic casing 32. In this embodiment, the number of the cylindrical anisotropic magnets 31 is sixteen, and the cylindrical anisotropic magnets 31 are arranged on a circle. In FIG. 2, the arrows indicate directions of magnetization. As shown in FIG. 2, the directions of magnetization of the successive cylindrical anisotropic magnets 31 are successively changed gradually to create a horizontal magnetic field B of a direction indicated by the blank arrow.

Figure 3:
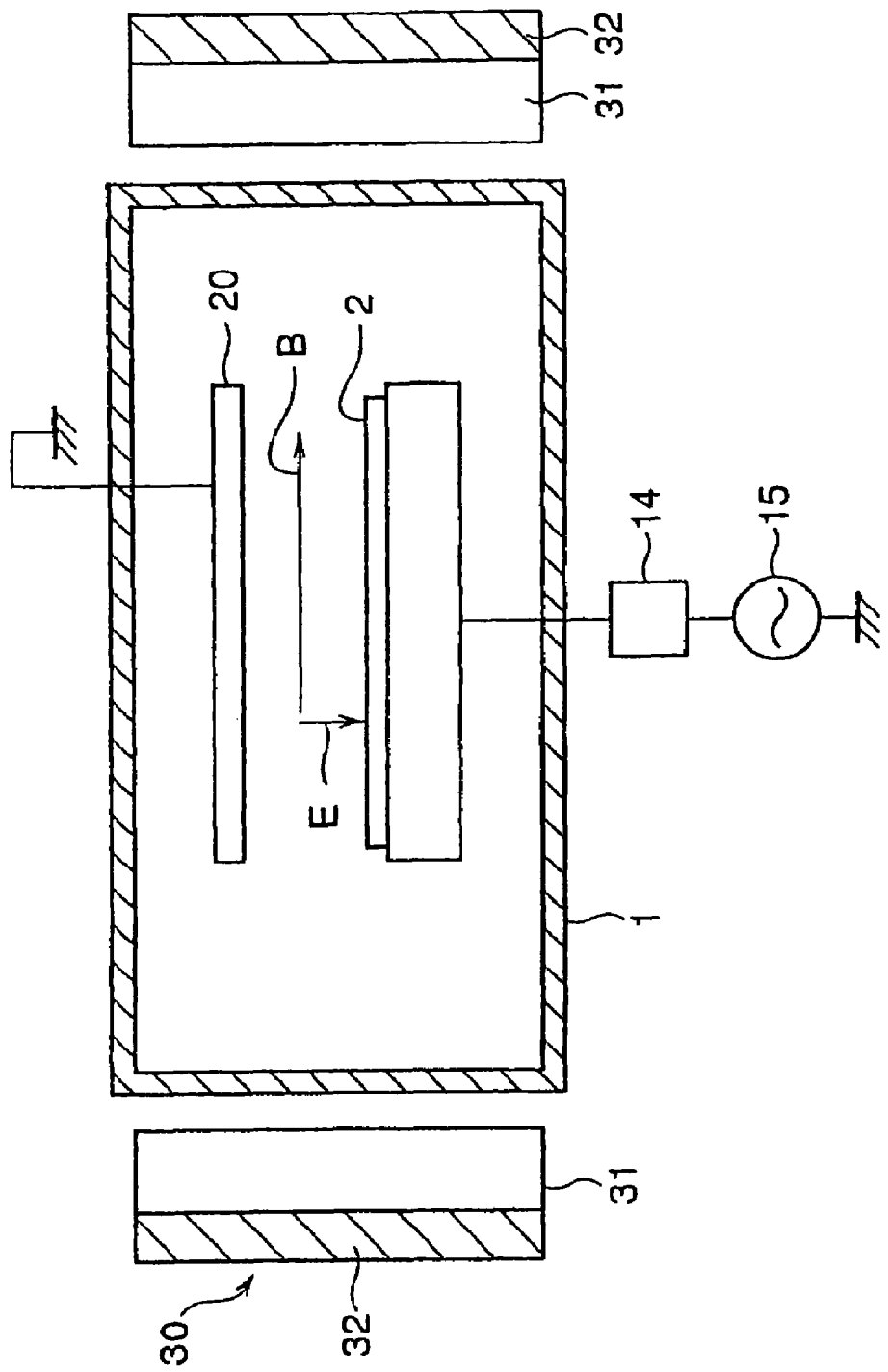
FIG. 3 is a typical view of assistance in explaining an electric field and a magnetic field created in the processing vessel.

As typically shown in FIG. 3, a vertical electric field E is created by the power supplied by the high-frequency power supply and the horizontal magnetic field B is created by the dipole magnetic ring 30 in the space extending between the support table 2 and the shower head 20. The vertical electric field E and the horizontal magnetic field B cause magnetron discharge, and the etching gas is discharged by the magnetron discharge to produce a high-energy plasma. An organic film formed on the wafer W is etched with the plasma.

An etching operation for etching an organic film will be described. The magnetron RIE system carries out the etching operation to etch the organic film through an inorganic film as a mask.

Figure 4:
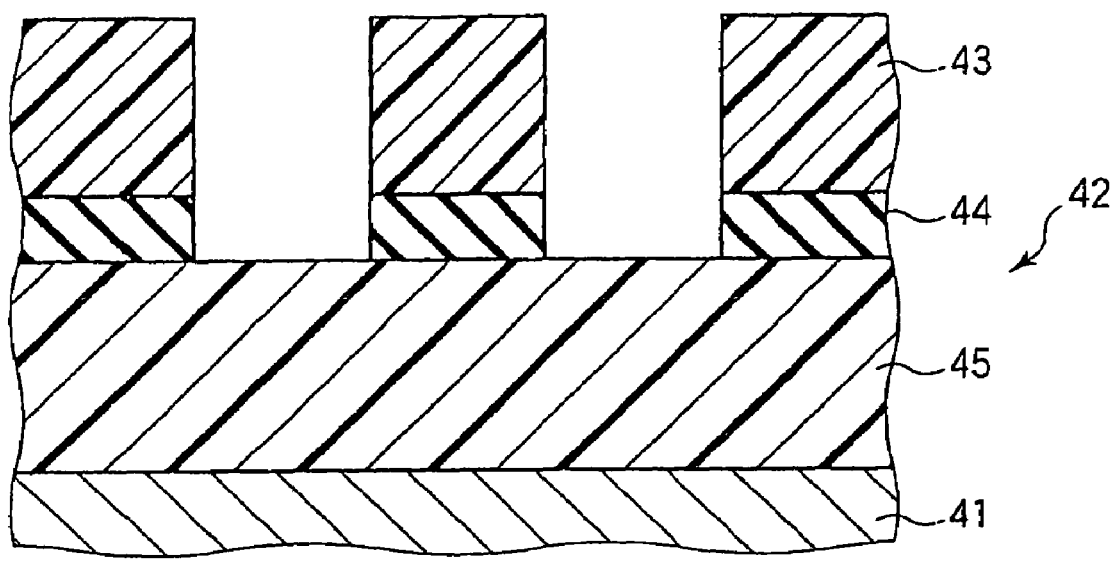
FIG. 4 is a typical, fragmentary sectional view of a multilayer resist film to be etched by the etching method of the present invention.

The etching method in this embodiment will be described as applied to etching a multilayer resist film. FIG. 4 shows a structure having a multilayer resist film in a sectional view by way of example and FIG. 5 shows another structure in a sectional view by way of example.

Referring to FIG. 4, a film 41 to be etched is formed on a wafer W, and a multilayer resist film 42 for etching the film 41 in a line-and-space pattern is formed on the film 41. The multilayer resist film 42 is a laminated structure having, from the top downward, a photoresist film 43 formed in a line-and-space pattern by exposure and development, an inorganic film 44 etched by using the photoresist film 43 as a mask, and an organic film 45. The organic film 45 is etched by using, as a mask, the inorganic film 44 etched by using the photoresist film 43 as a mask, and then the film 41 to be etched is etched by using the organic film 45 as a mask. Generally, line-and-space patterns have opening ratios not smaller than 40%. The opening ratio of a line-and-space pattern is on the order of 50% when lines forming the line-and-space pattern are arranged densely, and is as large as 90% when lines are arranged sparsely.

Figure 5:
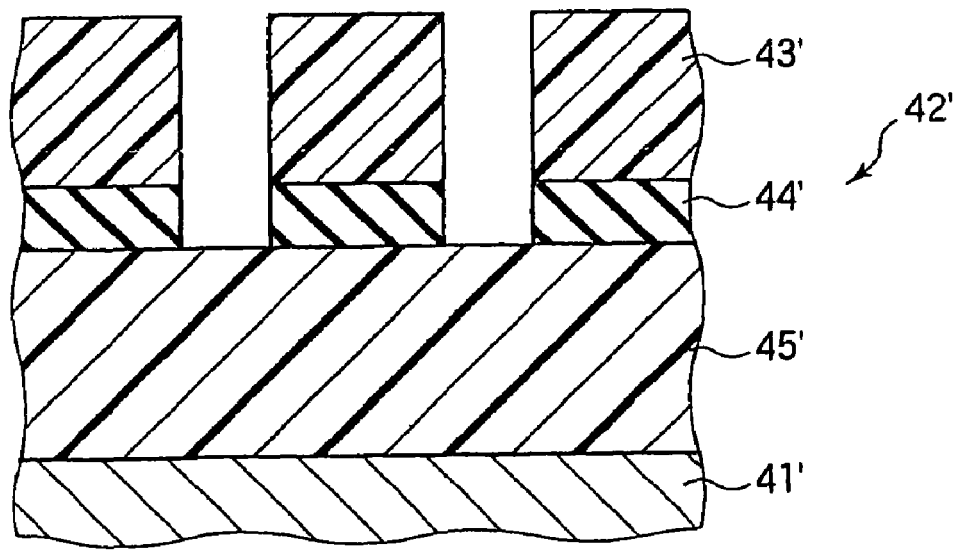
FIG. 5 is a typical fragmentary sectional view of another multilayer resist film to be etched by the etching method of the present invention.

Referring to FIG. 5, a film 41' to be etched is formed on a wafer W, and a multilayer resist film 42' for etching the film 41 in a perforated pattern is formed on the film 41'. The multilayer resist film 42' is a laminated structure having, from the top downward, a photoresist film 43' formed in a perforated pattern by exposure and development, an inorganic film 44' etched by using the photoresist film 43' as a mask, and an organic film 45'. The organic film 45' is etched by using, as a mask, the inorganic film 44' etched by using the photoresist film 43' as a mask, and then the film 41' to be etched is etched by using the organic film 45' as a mask. Generally, perforated patterns have opening ratios below 40%, and most perforated patterns have opening ratios on the order of 30%.

The inorganic films 44 and 44' may be formed of any material generally used for forming hard masks. Silicon oxides are suitable materials for forming the inorganic films 44 and 44'. In this embodiment, the inorganic films 44 and 44' are SOG films.

The organic films 45 and 45' are lower resist layers and do not need to be photosensitive. Material suitable for forming the organic film 45 and 45' may be those containing C and H, and those containing C, H and 0. A material having a high selectivity with respect to the films 41 and 41' to be etched underlying the organic films 45 and 45' is used. Preferably, the organic films 45 and 45' are formed of a C-rich material with a view to increase the etch selectivity of the organic films 45 and 45' with respect to the films 41 and 41' and to form the organic films 45 and 45' in a small thickness. The organic films 45 and 45' meeting such requirements are low-K films having a very small relative dielectric constant and used as layer insulating films and formed of a material containing Si, C, H and O. Materials for forming low-K films are, for example, polyorganosiloxane-crosslinked bis (benzocyclobutene) resins (BCB resins), polyarylene ether resins (PAE resins), such as SiLK® and FLARE® commercially available from Dow Chemical Co. and organic polysiloxane resins, such as methylsilsesquloxane (MSQ).

It is suitable to form the films 41 and 41' to be etched of at least one of $SiO_2$, SiON, SiN, SiOC and SiC.

The organic films 45 and 45' must be accurately etched by using the inorganic films 44 and 44' as a mask to transfer the patterns of the photoresist films 43 and 43' accurately to the films 41 and 41' to be etched.

When the organic film 45 shown in FIG. 4 is etched by the magnetron RIE system shown in FIG. 1 by using the inorganic film 44 as a mask, the gate valve 13 is opened, the wafer provided with the film 41 to be etched and the multilayer resist film 42 shown in FIG. 4 is loaded into the processing vessel 1 and the wafer W is mounted on the support table 2. Then, the support table 2 is raised to a position shown in FIG. 1 and the vacuum pump of the evacuating system 12 is actuated to evacuate the processing vessel 1 by sucking out gases from the processing vessel 1 through the exhaust port 11. The etching gas supply system 23 supplies $NH_3$ gas and $O_2$ gas, namely, etching gases, into the processing vessel 1. The $NH_3/O_2$ flow rate ratio is, for example, in the range of 4 to 10. Preferably, the residence time of the etching gas in the processing vessel 1 is in the range of 4 to 10 msec.

Residence time is the average length of time for which the etching gas contributes to etching in the processing vessel 1 and is expressed by:

$$\tau = V/S = pV/Q$$

where $\tau$ (sec) is residence time, V (m³) is effective chamber volume obtained by multiplying the area of the wafer W by interelectrode distance, i.e., the volume of a space containing the etching gas contributing to etching and excluding a space containing the etching gas not in contact with the wafer, S (m³/sec) is discharge rate, p (Pa) is the pressure in the processing vessel, and Q (Pa·m³/sec) is total flow rate.

Although the pressure of the gas in the processing vessel 1 is not limited, it is preferable that the pressure is in the range of 1.3 to 6.7 Pa.

After such an atmosphere of the etching gases has been created in the processing vessel 1, the high-frequency power source 15 supplies high-frequency power of a frequency not lower than 13.56 MHz to the support table 2. The dc power supply 16 applies a predetermined voltage to the electrode 6a of the electrostatic chuck 6 to attract the wafer W to and to hold the wafer W on the support table 2 by, for example, Coulomb's force. Thus a high-frequency electric field E is created between the shower head 20, namely, the upper electrode, and the support table 2, namely, the lower electrode. The dipole magnetic ring 30 creates a horizontal magnetic field B in the space between the shower head 20 and the support table 2. Consequently, the electric field E and the magnetic field B are created perpendicularly to each other in a processing space extending between the electrodes and containing the wafer W. The electric field E and the magnetic field B cause electrons to drift and magnetron discharge starts. The magnetron discharge discharges the etching gases to produce a plasma for etching the organic film formed on the wafer W through the inorganic film serving as a mask.

The organic film can be etched at a high etch rate in a satisfactory etch profile in satisfactory in-plane uniformity by using $NH_3$ gas and $O_2$ gas as etching gases. The residence time in the range of 5 to 10 msec further improves the in-plane uniformity of the etched organic film.

Etch profiles can be evaluated in terms of CD shift and actual sectional shape. CD shift is a shift in the position of a line or a hole viewed from above the inorganic mask. The absolute value of the CD shift must be 6 nm or below. The actual sectional shape is determined through the observation of a photomicrograph of a section taken by a scanning electron microscope (SEM). There must be no bowing in the sectional shape. Bowing is a curvature of the side wall 52 of a line 51 of a line-and-space pattern as shown in FIG. 6(a) or a curvature of the side wall 54 of a hole in a perforated pattern as shown in FIG. 6(b).

The plasma increases the temperature of the wafer W during etching. A coolant is circulated through the coolant chamber 17 to keep the wafer W at a predetermined temperature by controlling the temperature of the support table 2. The CD shift difference due to the density distribution of the lines increases if the temperature is excessively low, and lines have bowing sectional shape if the temperature is excessively high. Preferably, the temperature of the support table 2 is in the range of 40 to 80° C.

The dipole magnetic ring 30 creates a magnetic field in the processing space between the support table 2 and the shower head 20, namely, opposite electrodes, to increase the density of the plasma in a space directly above the wafer W. Preferably, the dipole magnetic ring 30 is capable of creating a magnetic field of a strength 3000 µT (30 Gauss) or above.

Figure 6:
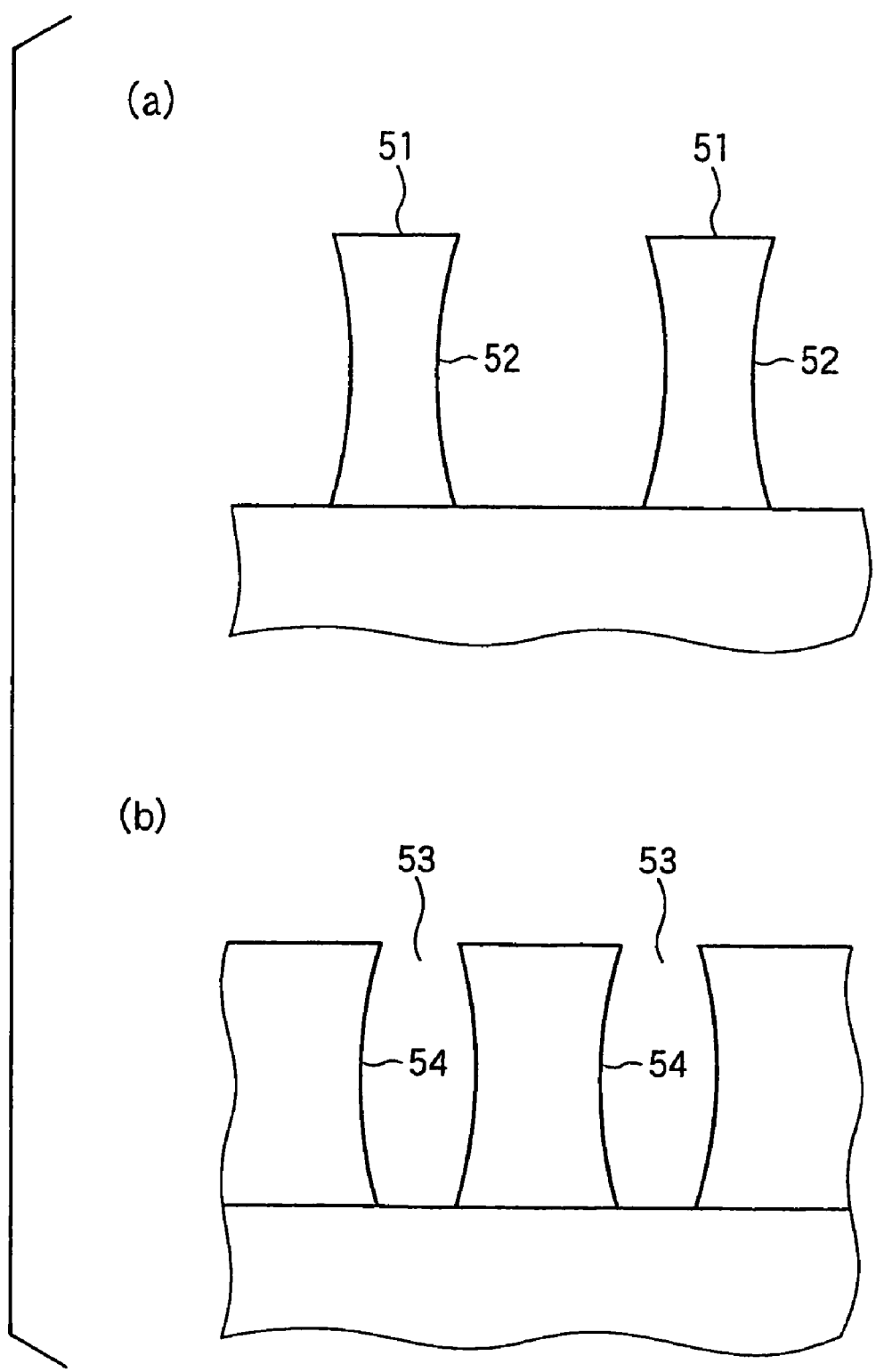
FIG. 6 is a view of assistance in explaining bowing.

When the organic film 45 is etched by the magnetron RIE system shown in FIG. 6 by using the inorganic film 44 shown in FIG. 5 as a mask, it is preferable to supply $NH_3$ gas as an etching gas into the processing vessel 1 by the etching gas supply system 23 after loading a wafer W into the processing vessel 1 and evacuating the processing vessel 1. Preferably, the residence time of the $NH_3$ gas supplied into the processing vessel 1 is 100 msec. The pressure in the processing vessel 1 may be in the range of 10 to 40 Pa.

After producing such a gas atmosphere in the processing vessel 1, the high-frequency power source supplies high-frequency power of a frequency of 13.56 MHz or above to the support table 2 to create a high-frequency electric field in the space extending between the shower head 20 and the support table 2. The dipole magnetic ring 30 creates a horizontal magnetic field B perpendicular to the electric field in the processing space extending between the electrodes and containing the wafer W. The electric field E and the magnetic field B cause electrons to drift and magnetron discharge starts. The magnetron discharge discharges the etching gases to produce a plasma for etching the organic film formed on the wafer W through the inorganic film serving as a mask.

The perforated pattern having an opening ratio below 40% can be formed by etching the organic films at a high etch rate by using $NH_3$ gas in a satisfactory etched pattern in satisfactory in-plane uniformity without causing the inorganic film to come off. The CD shift and bowing can be reduced by adjusting the residence time of the etching gas to 100 msec or below. In this case, it is preferable that the temperature of the support table 2 is in the range of −20 to 40° C. to etch the organic film in a satisfactory pattern and to reduce the CD shift difference due to etch depth. More preferably, the temperature of the support table is 20° C. or below.

The most suitable etching gas for etching an organic film in a pattern having an opening ratio of 40% or above and the most suitable etching gas for etching the organic film in a pattern having an opening ratio below 40% are different. Since the former etching gas differs from the latter etching gas only in that the former etching gas contains $O_2$ gas. Therefore, both an etching process for etching the organic film in a pattern having an opening ratio of 40% or above and an etching process for etching the organic film in a pattern having an opening ratio below 40% can be performed in the same processing vessel simply by supplying or not supplying $O_2$ gas. Therefore, etching processes for etching organic films formed on a plurality of wafers and intended to be etched in patterns respectively having different opening ratios, respectively, can be efficiently carried out. Thus organic films formed on wafers can be satisfactorily etched in different patterns at a high throughput.

When two etching processes are executed successively to etch organic films formed on two wafers in patterns having different opening ratios, respectively, at a high throughput, it is preferable that the temperature of the support table 2 dominating the temperature of the wafer is the same for those etching processes. A preferable temperature for the pattern having an opening ratio of 40% or above is in the range of 40 to 80° C., and a preferable temperature for the pattern having an opening ratio below 40% is in the range of −20 to 40° C. although a preferable temperature range is different depending on an opening ratio. The range of 20 to 40° C. is available. Therefore time necessary for changing the temperature of the support table is not necessary and etching processes respectively for etching organic films in patterns respectively having different opening ratios can be efficiently carried out.

Etch profile can be adjusted by adjusting the $NH_3/O_2$ flow rate ratio in etching an organic film in a pattern of an opening ratio of 40% or above. Etch profile can be adjusted by adjusting the residence time of $NH_3$ gas in etching an organic film in a pattern of an opening ratio below 40%. The $NH_3/O_2$ flow rate ratio is determined so that the absolute value of CD shift is 6 nm or below in etching a film in a pattern having an opening ratio of 40% or above, and the residence time of $NH_3$ gas is adjusted so that the absolute value of CD shift is 6 nm or below in etching an organic film in a pattern having an opening ratio below 40%.

Although the etching method in this embodiment uses the dipole magnetic ring for creating the magnetic field perpendicular to the electric field, the magnet is not indispensable. A multipole magnetic ring for creating a magnetic field around the wafer to confine the plasma in the space around the wafer instead of the dipole magnetic ring for creating the magnetic field perpendicular to the electric field.

Experiments carried out to demonstrate the effect of the present invention will be described.

(1) Etching for Forming Line-and-Space Pattern

An organic film 45 was patterned in a dense pattern having lines of 0.13 μm in width and spaces of 0.13 μm in width and an opening ratio of 50% as shown in FIG. 7(*a*). Another organic film 45 was patterned in a sparse pattern having sparsely arranged lines of 0.16 μm in width and an opening ratio of 90% as shown in FIG. 7(*b*).

The magnetron RIE system provided with the dipole magnetic ring was used for etching. As shown in FIG. 4, a SOG film (inorganic film) for forming a hard mask was patterned by etching, and a CT film (C-rich film), i.e., an organic film forming a lower resist layer, was patterned by etching using the patterned SOG film as a mask and a mixed etching gas prepared by mixing $NH_3$ gas and $O_2$ gas. Etching conditions were: temperature of the support table: 80° C., gap between the electrodes: 27 mm, $NH_3$ flow rate: 0.35 l/min, $O_2$ flow rate: 0.035 l/min, pressure in the processing vessel: 4.0 Pa, frequency of high-frequency power: 40 MHz, output capacity of the high-frequency power source: 400 W, etching time: time for 15% overetching, and residence time of the etching gas: 5.2 msec. Etch rate was as high as 307.9 nm/min and in-plane uniformity was ±1.6%. Both etch rate and in-plane uniformity were satisfactory. CD shifts were −4 nm and 3 nm in a central part and an edge part, respectively, of the dense pattern. CD shifts were 1 nm and −2 nm in a central part and an edge part, respectively, of the sparse pattern. No bowing occurred in the patterns and the patterns had a satisfactory etch profile.

Organic films were etched similarly in the same dense and sparse patterns by an etching method in a comparative example using a mixed etching gas prepared by mixing $N_2$ gas and $O_2$ gas for comparison. Etching conditions were: temperature of the support: table 40° C., gap between the electrodes: 27 mm, pressure in the processing vessel: 2.7 Pa, frequency of high-frequency power source: 40 MHz, and output capacity of the high-frequency power supply: 400 W. Only $O_2$ gas was supplied at a flow rate of 0.05 l/min in an initial stage of 30 sec of the etching process, and $N_2$ gas and $O_2$ gas were supplied at flow rates of 0.1 l/min and 0.01 l/min, respectively, in a subsequent stage of 34 sec (15% overetching). Etch rate was 257.2 nm/min, in-plane uniformity was ±5.1%. The etching method in the comparative example was inferior to the etching method of the present invention in both etch rate and in-plane uniformity. CD shifts were −8 nm and −6 nm in a central part and an edge part, respectively, of the dense pattern, and were −7 nm and −9 nm in a central part and an edge part, respectively, of the sparse pattern, which were greater than those in the dense and the sparse pattern formed by the etching method of the present invention. Slight bowing occurred in the etched patterns.

Experiments were conducted to determine the effect of the residence time of the mixed etching gas prepared by mixing $NH_3$ gas and $O_2$ gas, in which organic films were etched by experimental etching processes similar to the foregoing etching methods. Etching conditions common to Experiments 1, 2, 3 and 4 are: temperature of the support table: 80° C., gap between the electrodes: 27 mm, frequency of high-frequency power: 40 MHz, output capacity of the high-frequency power source: 400 W and etching time: 60 sec.

Experiment 1
$NH_3$ gas flow rate: 0.25 l/min
$O_2$ gas flow rate: 0.025 l/min
Pressure in processing vessel: 2.7 Pa
Residence time: 4.9 msec Experiment 2
$NH_3$ gas flow rate: 0.35 l/min
$O_2$ gas flow rate: 0.035 l/min
Pressure in processing vessel: 4.0 Pa
Residence time: 5.2 msec.

Experiment 3
$NH_3$ gas flow rate: 0.43 l/min
$O_2$ gas flow rate: 0.043 l/min
Pressure in processing vessel: 5.4 Pa
Residence time: 5.7 msec.

Figure 8:
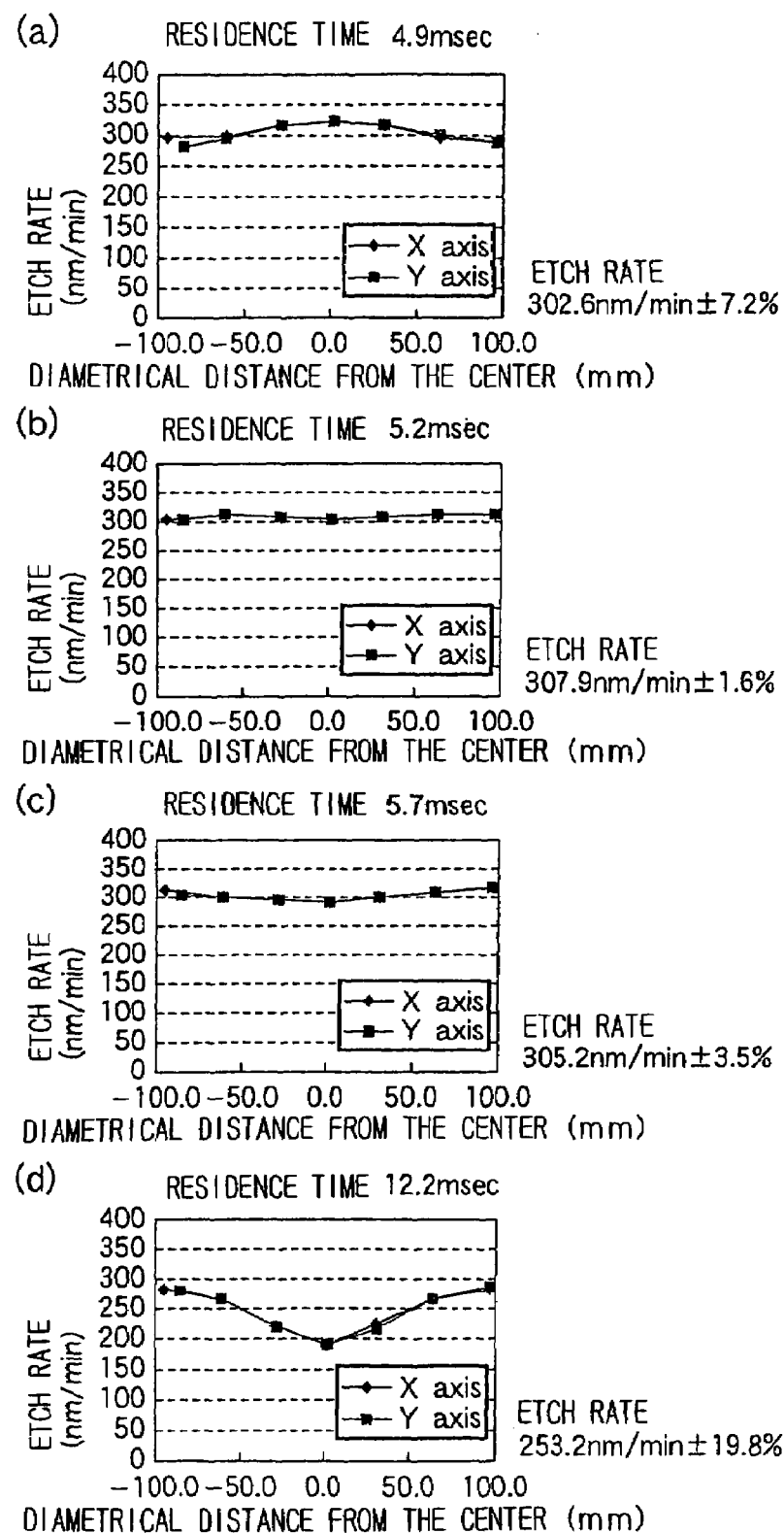
FIG. 8 is a graph showing the dependence of etch rate and etch uniformity on the residence time of an etching gas in etching a film in a line-and-space pattern.

Experiment 4
$NH_3$ gas flow rate: 0.10 l/min
$O_2$ gas flow rate: 0.010 l/min
Pressure in processing vessel: 2.7 Pa
Residence time: 12.2 msec FIGS. 8(*a*) to 8(*d*) show the results of Experiments 1 to 4, respectively. In Experiments 1 to 3, residence times were as short as about 5 msec and hence the organic films were etched at high etch rates exceeding 300 nm/min in satisfactory in-plane uniformity. In Experiment 4, residence time was longer than 10 msec and hence the organic film was etched at a low etch rate of 253.2 nm/min and the etched organic film had a low in-plane uniformity. The organic film etched by Experiment 2, in which residence time was 5.2 msec, had the highest in-plane uniformity among those etched by Experiments 1 to 3.

Figure 10:
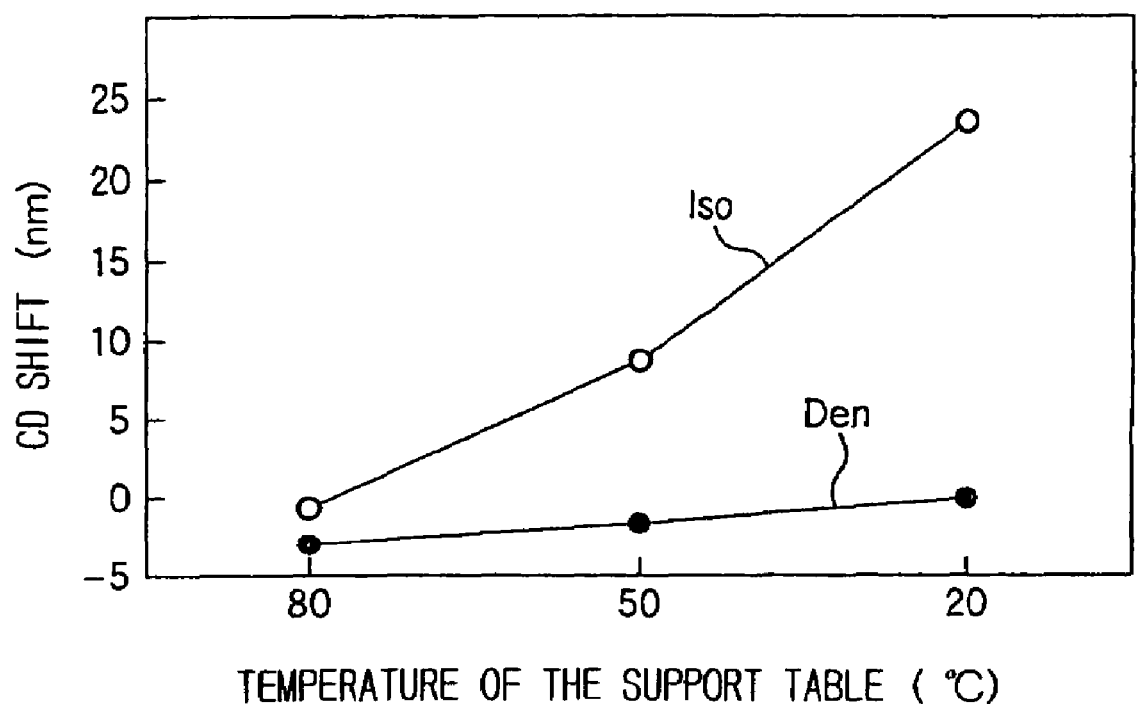
FIG. 10 is a graph showing the dependence of CD shift in dense and sparse patterns on the temperature of the support table.

Experiments were conducted to study the effect of temperature on etching. The experiments used a multipole magnetic ring instead of the dipole magnetic ring. Etching conditions were: gap between the electrodes: 27 mm, $NH_3$ gas flow rate: 0.35 l/min, $O_2$ gas flow rate: 0.035 l/min, pressure in the processing vessel: 4.0 Pa, frequency of high-frequency power: 40 MHz, output capacity of the high-frequency power source: 400 W, etching time: time for 15% overetching, and residence time: 5.2 msec Temperatures of the support table were 20° C., 50° C. and 80° C. for Experiments 1, 2 and 3. FIGS. 9(*a*), 9(*b*) and 9(*c*) show the results Experiments 1 to 3, respectively. As obvious from FIGS. 9(*a*) to 9(*c*), the temperature of the support table did not have significant effect on etch rate, and a value indicating the etching uniformity of the organic film etched by Experiment 1, in which the temperature of the support table was 20° C., was the smallest. It is known from FIG. 10 that the lower the temperature of the support table, the greater is the CD shift difference between dense pattern and sparse pattern. It was decided from data shown in FIGS. 9 and 10 that a temperature around 80° C. is the most desirable temperature of the support table. However, bowing occurs when the temperature of the support table is higher than 80° C.

It is preferable that the temperature of the support table is in the range of 20 to 40° C. when organic films are etched in line-and-space patterns and perforated patterns in the same processing vessel keeping the support table at the same temperature. However, the CD shift of the sparse pattern increases if the temperature of the support table is 40° C. Experiments were conducted by using the magnetron RIE system provided with the dipole magnetic ring and mixed etching gases respectively having different $NH_3/O_2$ gas concentration ratios. Basic etching conditions were: gap between the electrodes: 27 mm, pressure in the processing vessel: 4.0 Pa, frequency of high-frequency power: 40 MHz and output capacity of the high-frequency power source: 400 W, etching time: time for 15% overetching and temperature of the support table: 40° C.

Experiment 1
$NH_3$ gas and $O_2$ gas were supplied at 0.35 l/min and 0.035 l/min, respectively, the $O_2$ gas concentration of the etching gas was 9.1% and residence time was 5.2 msec.

Experiment 2
$NH_3$ gas and $O_2$ gas were supplied at 0.35 l/min and 0.045 l/min, respectively, the $O_2$ gas concentration of the etching gas was 11.4% and residence time was 5.1 msec.

Experiment 3
$NH_3$ gas and $O_2$ gas were supplied at 0.25 l/min and 0.050 l/min, respectively, the $O_2$ gas concentration of the etching gas was 16.7% and residence time was 6.7 msec.

Results of experiments were as follows.
Experiment 1
Etch rate: 352.7 nm/min
In-plane uniformity: ±1.7
CD shift in dense pattern: −1 nm (center), 5 nm (edge)
CD shift in sparse pattern: 14 nm (center), 19 nm (edge).
Experiment 2
Etch rate: 355.1 nm/min
In-plane uniformity: ±1.3
CD shift in dense pattern: 3 nm (center), 6 nm (edge)
CD shift in sparse pattern: 15 nm (center), 20 nm (edge).
Experiment 3
Etch rate: 350.9 nm/min
In-plane uniformity: ±3.3
CD shift in dense pattern: 0 nm (center), 1 nm (edge)
CD shift in sparse pattern: 8 nm (center), 10 nm (edge).

As obvious from those results, the etching conditions for Experiment 3 were the best. However, the CD sift difference was not satisfactory.

Experiments 4 and 5 were conducted for different $NH_3/O_2$ flow rate ratios.

Experiment 4
$NH_3$ gas and $O_2$ gas were supplied at 0.245 l/min and 0.055 l/min, respectively, the $O_2$ gas concentration of the etching gas was 18.3% and residence time was 6.7 msec.

Experiment 5
$NH_3$ gas and $O_2$ gas were supplied at 0.24 l/min and 0.060 l/min, respectively, the $O_2$ gas concentration of the etching gas was 20.0% and residence time was 6.7 msec.

FIGS. 11 and 12 show the results of Experiments 3, 4 and 5 comparatively. FIGS. 11(*a*), 11(*b*) and 11(*c*) show etch rates and in-plane uniformities in Experiments 3, 4 and 5, respectively. As obvious from FIG. 11, all the etch rates and all the in-plane uniformities were satisfactory. FIG. 12 shows the dependence of CD shift on $O_2$ gas concentration. The CD shift difference was excessively large when the $O_2$ gas concentration was 16.7% (Experiment 3). When the $O_2$ gas concentration was 18.3% (Experiment 4) and 20% (Experiment 5) the CD shift difference was smaller than that when the $O_2$ gas concentration was 16.7% (Experiment 3). The absolute values of CD shifts of both the dense and the sparse pattern formed by Experiment 4 were 6 nm or below. Although the CD shift difference in the patterns formed by Experiment 5 are not very large, bowing surfaces were liable to be formed in those patterns. It was confirmed on the basis of those experimental data that it is effective to use an etching gas having an $O_2$ gas concentration on the order of 18% when films formed on wafers are patterned in line-and-space patterns with the wafers supported on the support table at 40° C.

(2) Etching for Forming Perforated Pattern

An organic film was patterned in a perforated pattern having elliptic openings of 0.13 μm in minor axis and 0.27 μm in major axis.

The magnetron RIE system provided with the dipole magnetic ring was used for etching. As shown in FIG. 5, a SOG film (inorganic film) for forming a hard mask was patterned by etching, and a CT film (C-rich film), i.e., an organic film forming a lower resist layer, was patterned by etching using the patterned SOG film as a mask and $NH_3$ gas as an etching gas. Etching conditions were: temperature of the support table: 40° C., gap between the electrodes: 47 mm, $NH_3$ flow rate: 0.40 l/min, pressure in the processing vessel: 4.0 Pa, frequency of high-frequency power: 40 MHz, output capacity of the high-frequency power source: 1000 W, etching time: time for 15% overetching, and residence time of the etching gas: 87.5 msec. Etch rate was as high as 684.9 nm/min and in-plane uniformity was ±3.9%. Both etch rate and in-plane uniformity were satisfactory. CD shifts were 5 nm and 1 nm in a central part and an edge part, respectively, on the minor axis. CD shifts were 3 nm and 1 nm in a central part and an edge part, respectively, on the major axis. Those CD shifts are within the range of ±6 nm. The patterns had a satisfactory etch profile. The peeling resistance of a full-surface SOG film, namely, the inorganic film, was tested. The full-surface SOG film did not peel off when the full-surface SOG film was subjected to etching for a 108% time equal to 108% of a time needed to etch the organic film completely. The 108% time is longer than a 100% time, i.e., a standard time indicating satisfactory peeling resistance. Sample SOG films were examined for peeling resistance. None of the sample SOG film peeled off before a 150% time, which proved that there are not any practical problems in those sample SOG films.

Organic films were etched similarly by an etching method in a comparative example using conventional etching gases. Etching conditions were: temperature of the support: table 40° C., gap between the electrodes: 27 mm, pressure in the processing vessel: 2.7 Pa, frequency of high-frequency power source: 40 MHz, and output capacity of the high-frequency power supply: 400 W. Only $O_2$ gas was supplied at a flow rate of 0.05 l/min in an initial stage of 40 sec of the etching process, and $N_2$ gas and $O_2$ gas were supplied at flow rates of 0.1 l/min and 0.01 l/min, respectively, in a subsequent stage of 60 sec (15% overetching). Etch rate was 257.2 nm/min, in-plane uniformity was ±5.1%. The etching method in the comparative example was inferior to the etching method of the present invention in both etch rate and in-plane uniformity. CD shift was +25 nm, which was greater than those in the range achieved by the present invention. Slight bowing occurred in the etched pattern. The SOG film started to peel off when 73% of the same was etched. The peeling resistance of the SOG film was unsatisfactory.

Figure 13:
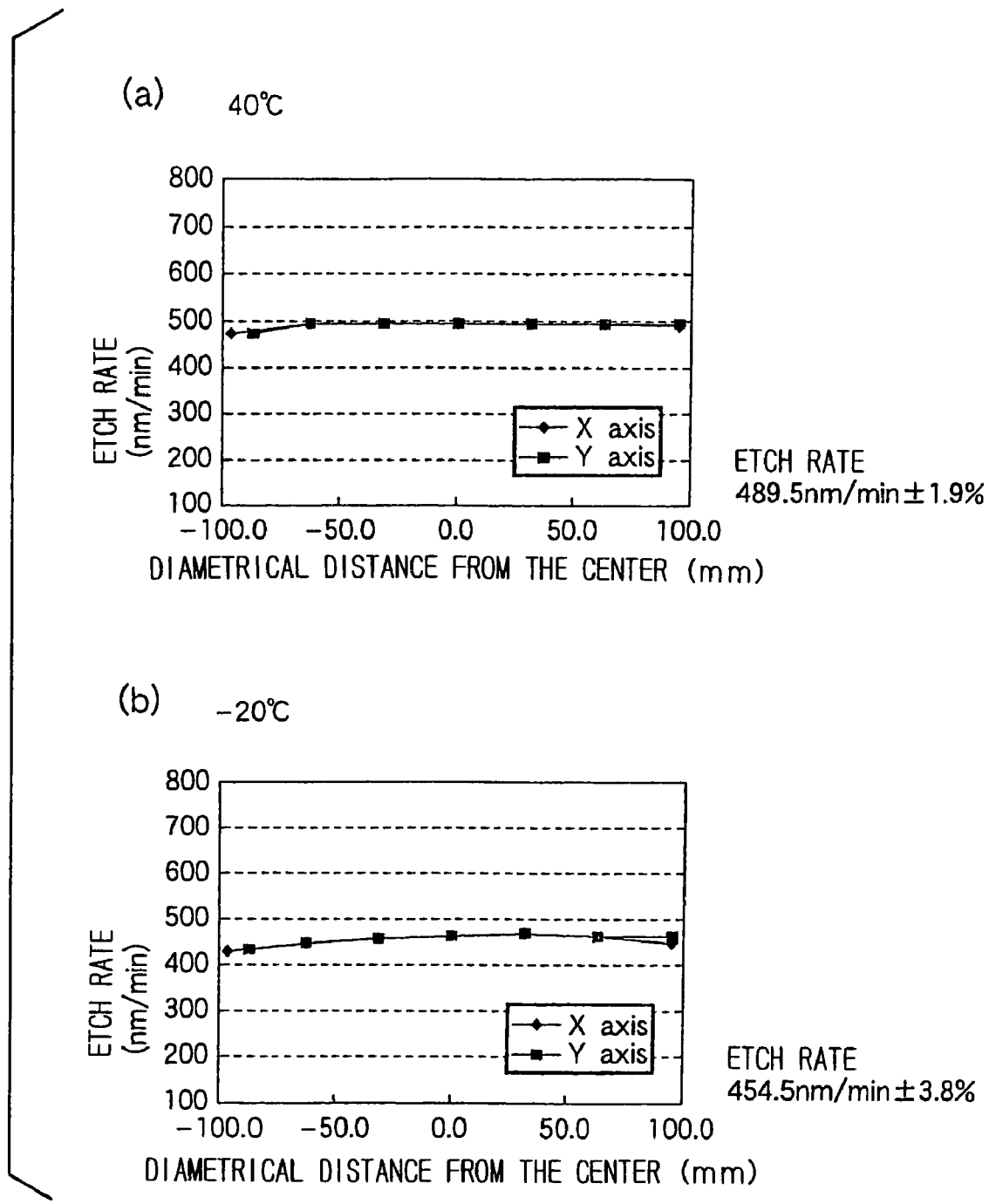
FIG. 13 is a graph showing the dependence of etch rate and etch uniformity on the temperature of a support table in etching a film in a perforated pattern.

Experiments were conducted to study the effect of temperature on etching. The same magnetron RIE system was used and the same perforated pattern was formed by etching. Etching conditions were: gap between the electrodes: 47 mm, $NH_3$ gas flow rate: 0.10 l/min, pressure in the processing vessel: 4.0 Pa, frequency of high-frequency power: 40 MHz, output capacity of the high-frequency power source: 1000 W, and residence time: 350 msec Temperatures of the support table were 40° C. and −20° C. for Experiments 1 and 2. FIGS. 13(a) and 13(b) show the results Experiments 1 and 2, respectively. As obvious from FIGS. 13(a) and 13(b), the temperature of the support table did not have significant effect on etch rate and in-plane uniformity. CD shifts were 6.3 nm and 1.0 nm in a central part and an edge part, respectively, on the minor axis, and CD shifts were 8.7 nm and 9.0 nm in a central part and an edge part, respectively, on the major axis when the temperature of the support table was 40° C. Thus the CD shift difference between the minor and the major axis is large, and there was a tendency for the holes to enlarge. CD shifts were −9.7 nm and −11.7 nm in a central part and an edge part, respectively, on the minor axis, and CD shifts were −11 nm and −10 nm in a central part and an edge part, respectively, on the major axis when the temperature of the support table was −20° C. Thus the CD shift difference between the minor and the major axis is small, and there was a tendency for the holes to diminish. Bowing was distinct when the temperature of the support table was 40° C. and was slight when the temperature of the support table was −20° C., which proved that blowing can be suppressed by decreasing the temperature of the support table. The full-surface SOG film started to peel off after the etching time had exceeded a 155% time and the sample SOG film started to peel off after the etching time had exceeded 192% when the temperature of the support table was 40° C. The full-surface SOG film started to peel off after the etching time had exceeded a 160% time and the sample SOG film did not start to peel off even after the etching time had exceeded 200% when the temperature of the support table was −20° C. SOG films etched with the support table kept at −20° C. were superior to those etched with the support table kept at 40° C. in etch profile and peeling resistance. Thus, it was concluded that temperatures of the support table in the range of −20 to 40° C. are preferable.

Although keeping the support table at −20° C. during etching is preferable to keeping the same at 40° C. during etching, it is preferable that the temperature of the support table is in the range of 20 to 40° C. when the etching process for etching films in a line-and-space pattern and the etching process for etching films in a perforated pattern are performed in the same processing vessel with the support table kept at the same temperature. Therefore it is desired to determine etching conditions such that satisfactory etching can be achieved with the support table kept at 40° C. As mentioned above, the SOG film can be satisfactorily etched by increasing the flow rate of $NH_3$ gas from 0.10 l/min to 0.40 l/min, i.e., by reducing the residence time from 350 msec to 87.5 msec, so that CD shifts are 5 nm and 1 nm in a central part and an edge part, respectively, on the minor axis, CD shifts are 3 nm and 1 nm in a central part and an edge part, respectively, on the major axis, blowing occurs scarcely, and the peeling resistance of the SOG film is satisfactory. Thus it was found that the SOG film could be etched in a satisfactory shape by supplying $NH_3$ gas at a comparatively high flow rate even if the support table was kept at 40° C.

The present invention is not limited to the foregoing embodiment and various changes and variations are possible. For example, the dipole magnetic ring of the magnetron RIE system may be replaced by any suitable magnet, and the creation of a magnetic field is not necessarily indispensable. Any suitable plasma etching system, such as a capacitively coupled plasma-enhanced etching system or an inductively coupled plasma-enhanced etching system, may be used instead of the magnetron RIE system, provided that the etching system meets the requirements of the present invention. A capacitively coupled plasma-enhanced etching system is preferable with a view to etch a film at a high selectivity in an atmosphere having a moderate plasma density. Although the present invention has been described as applied to etching the multilayer resist film, the present invention is applicable to etching an organic film by using an inorganic film as a mask.

The ratio of the area of openings to be formed by etching in a film formed on a wafer to the total area of the film may be determined on the basis of data obtained by measuring the surface shape of the film by a surface shape measuring device before subjecting the film to etching, and etching conditions including an etching gas and the temperature of the support table can be automatically determined on the basis of the data provided by the surface shape measuring device. A shape measuring device may be a particle detecting device. The area of openings can be determined through the analysis of an image of the surface of a mask layer formed by the particle detecting device. The shape measuring device may be a separate device or a device included in the etching system.

As apparent from the foregoing description, according to the present invention, optimum plasma-assisted etching of an organic film formed on a workpiece using an inorganic film as a mask can be achieved by selectively using an optimum etching gas according to a pattern in which the organic film is to be etched, i.e., an etching gas prepared by mixing $NH_3$ gas and $O_2$ gas for etching the organic film in a pattern having an opening ratio of 40% or above or $NH_3$ gas as an etching gas for etching the organic film in a pattern having an opening ratio below 40%. Thus the organic film can be etched at a high etch rate, in satisfactory etch profiles in satisfactory in-plane uniformity without causing the inorganic film to come off.

Since different etching gases are used selectively according to the opening ratios of patterns in which the organic films are to be patterned, and organic films formed on workpieces are subjected to etching processes in the same processing vessel. Therefore, organic films formed on workpieces can be etched in patterns respectively having different opening ratios by etching processes of substantially the same etching conditions simply by changing the etching gas and without greatly changing the etching conditions. Thus organic films formed respectively on a plurality of workpieces can be efficiently etched in different patterns in the same processing vessel in a satisfactory etch profile, at high etch rates in satisfactory in-plane uniformity without causing the inorganic film to peel off.

The invention claimed is:

1. An etching method comprising:
   using an inorganic film as a mask for etching an organic film formed on a workpiece with a plasma of an etching gas in a processing vessel,
   using a mixed gas containing $NH_3$ gas and $O_2$ gas for etching the organic film when the organic film is to be etched in a pattern having an opening ratio of 40% or above, and
   using $NH_3$ gas without $O_2$ gas for etching the organic film when the organic film is to be etched in a pattern having an opening ratio below 40%.

2. The etching method according to claim 1, wherein a support device supporting the workpiece is maintained at a temperature in the range of 40 to 80° C. when the organic film is to be etched in a pattern having an opening ratio of 40% or above, and is maintained at a temperature in the range of −20 to 40° C. when the organic film is to be etched in a pattern having an opening ratio below 40%.

3. The etching method according to claim 1, wherein patterns having an opening ratio of 40% or above are line-and-space patterns, and patterns having an opening ratio below 40% are perforated patterns.

4. The etching method according to claim 1, wherein an inorganic material forming the inorganic film contains silicon oxide as a principal component.

5. The etching method according to claim 1, wherein the organic film is a low-K film.

6. The etching method according to claim 1, wherein the workpiece is provided with a film to be etched underlying the organic film, and the film to be etched is etched by using the organic film as a mask.

7. The etching method according to claim 6, wherein the film to be etched underlying the organic film is at least one of $SiO_2$ film, a SiON film, a SiN film, a SiOC film and a SiC film.

8. The etching method according to claim 1, wherein the plasma is produced by a capacitively coupled plasma producing device that creates a high-frequency electric field between a pair of opposite electrodes.

9. The etching method according to claim 8, wherein a magnetic field perpendicular to the electric field is created between the pair of opposite electrodes for etching.

10. An etching method using inorganic film as a mask for etching an organic film formed on a workpiece with a plasma of an etching gas in a processing vessel, said etching method characterized in that a mixed gas containing $NH_3$ gas and $O_2$ gas is used for etching the organic film when the organic film is to be etched in a pattern having an opening ratio of 40% or above, and $HN_3$ gas is used as an etching gas for etching the organic film when the organic film is to be etched in a pattern having an opening ratio below 40%,
   wherein the etching gas is supplied so that the residence time of the etching gas is in the range of 4 to 10 msec when the organic film is to be etched in a pattern having an opening ratio of 40% or above, and the etching gas is supplied so that the residence time of the etching gas is 100 msec or below when the organic film is to be etched in a pattern having an opening ratio below 40%.

11. An etching method comprising:
   using an inorganic film as a mask for etching an organic film formed on a workpiece with a plasma of an etching gas in a processing vessel,
   using, in the same processing vessel, a first etching process with a mixed gas containing $NH_3$ gas and $O_2$ gas for etching the organic film when the organic film is to be etched in a pattern having an opening ratio of 40% or above, and
   using, in the same processing vessel, a second etching process with $NH_3$ gas but without $O_2$ gas as an etching gas for etching the organic film when the organic film is to be etched in a pattern having an opening ratio below 40%.

12. The etching method according to claim 11, wherein the temperature of a support device supporting the workpiece is in the range of 20 to 40° C. in the first and the second etching process.

13. The etching method according to claim 11, wherein the $NH_3/O_2$ flow rate ratio is determined so that the absolute value of CD shift is 6 nm or below when the organic film is to be etched in a patter having an opening ratio of 40% or above, and the residence time of $NH_3$ gas is determined so that the absolute value of CD shift is 6 nm or below when the organic film is to be etched in a pattern having an opening ratio below 40%.

14. The etching method according to claim 11, wherein patterns having an opening ratio of 40% or above are line-and-space patterns, and patterns having an opening ratio below 40% are perforated patterns.

15. The etching method according to claim 11, wherein the organic film is a low-K film.

16. The etching method according to claim 11, wherein the workpiece is provided with a film to be etched underlying the organic film, and the film to be etched is etched by using the organic film as a mask.

17. The etching method according to claim 16, wherein the film to be etched underlying the organic film is at least one of $SiO_2$ film, a SiON film, a SiN film, a SiOC film and a SiC film.

18. The etching method according to claim 11, wherein the plasma is produced by a capacitively coupled plasma producing device that creates a high-frequency electric field between a pair of opposite electrodes.

19. The etching method according to claim 18, wherein a magnetic field perpendicular to the electric field is created between the pair of opposite electrodes for etching.

* * * * *